US009634069B2

(12) United States Patent
Ito et al.

(10) Patent No.: US 9,634,069 B2
(45) Date of Patent: Apr. 25, 2017

(54) DISPLAY DEVICE

(71) Applicant: Japan Display Inc, Tokyo (JP)

(72) Inventors: Ryoichi Ito, Tokyo (JP); Toshihiro Sato, Tokyo (JP)

(73) Assignee: Japan Dislay Inc., Tokyo (JP)

( * ) Notice: Subject to any disclaimer, the term of this patent is extended or adjusted under 35 U.S.C. 154(b) by 0 days.

(21) Appl. No.: 15/204,384

(22) Filed: Jul. 7, 2016

(65) Prior Publication Data

US 2016/0322435 A1  Nov. 3, 2016

Related U.S. Application Data

(63) Continuation of application No. 14/847,923, filed on Sep. 8, 2015, now Pat. No. 9,406,731.

(30) Foreign Application Priority Data

Sep. 17, 2014   (JP) ................................. 2014-188588

(51) Int. Cl.
*H01L 51/00* (2006.01)
*H01L 27/32* (2006.01)
*H01L 51/52* (2006.01)

(52) U.S. Cl.
CPC .......... *H01L 27/3244* (2013.01); *H01L 27/32* (2013.01); *H01L 51/0096* (2013.01); *H01L 51/5253* (2013.01); *H01L 2251/301* (2013.01); *H01L 2251/556* (2013.01)

(58) Field of Classification Search
CPC ............................ H01L 27/3244; H01L 51/00
See application file for complete search history.

(56) References Cited

U.S. PATENT DOCUMENTS

2010/0090593 A1   4/2010  Mori et al.
2014/0042398 A1   2/2014  Choi et al.
2016/0181345 A1*  6/2016  Lee ..................... H01L 27/3276
                                              257/40

FOREIGN PATENT DOCUMENTS

JP        2010-114429 A     5/2010

* cited by examiner

*Primary Examiner* — Roy Potter
*Assistant Examiner* — Paul Patton
(74) *Attorney, Agent, or Firm* — Typha IP LLC

(57) ABSTRACT

A display device includes an element substrate including a display area where a plurality of self-light-emitting elements are formed, and a driver IC disposed outside the display area in the element substrate. A first metal layer is disposed on the reverse side of the element substrate at a position opposite to the display area. A second metal layer is disposed with a space between the first metal layer and the second metal layer on the reverse side of the element substrate at a position opposite to the driver IC.

36 Claims, 5 Drawing Sheets

DISPLAY DEVICE

CROSS-REFERENCE TO RELATED APPLICATION

This application is a continuation of U.S. patent application Ser. No. 14/847,923, filed on Sep. 8, 2015. Further, this application claims priority from Japanese application JP2014-188588 filed on Sep. 17, 2014, the entire contents of which are hereby incorporated by reference into this application.

BACKGROUND OF THE INVENTION

1. Field of the Invention

The present invention relates to a display device.

2. Description of the Related Art

As one of display devices including a self-light-emitting element in a pixel circuit, an organic EL display device is known.

In each of pixels of such an organic EL display device, a self-light-emitting element configured to include an upper electrode, a lower electrode, and an organic layer interposed therebetween is disposed. In the organic layer, holes and electrons injected from the upper electrode and the lower electrode, respectively, are recombined together, so that light is emitted.

JP 2010-114429 A discloses an organic EL display device in which a heat equalizing means is provided on both the front and reverse surfaces of a substrate.

SUMMARY OF THE INVENTION

When the self-light-emitting element described above is maintained at a high temperature for a long time, the life of the self-light-emitting element is shortened.

Here, outside a display area where a plurality of self-light-emitting elements are arranged, a driver IC that performs display control of each pixel in the display area is disposed. The driver IC is a heat source during image display. Therefore, the self-light-emitting elements arranged at a place near the driver IC are likely to be exposed to a high-temperature state, so that the deterioration of self-light-emitting elements may progress at the place.

In view of the problem described above, it is an object of the invention to provide a display device in which the progress of deterioration of a self-light-emitting element in a display area due to a high temperature is prevented.

(1) In view of the problem described above, a display device according to an aspect of the invention includes: an element substrate including a display area where a plurality of self-light-emitting elements are formed; and a driver IC disposed outside the display area in the element substrate, wherein a first metal layer is disposed on the reverse side of a position serving as the display area in the element substrate, and a second metal layer is disposed with a space between the first metal layer and the second metal layer on the reverse side of a position where the driver IC is disposed in the element substrate.

(2) In (1), the first metal layer and the second metal layer may be covered with a protective layer formed of an insulating layer.

(3) In (1) and (2), the driver IC may be disposed in an area exposed from a counter substrate that is disposed to face the element substrate, and the second metal layer may be bent while extending on the reverse side of the exposed area where the driver IC is disposed, and extend on the reverse side of an area overlapping the counter substrate and located outside the display area where the plurality of self-light-emitting elements are formed.

(4) In (1) to (3), the first metal layer and the second metal layer may be divided by the space and each may be formed in an island-shape.

(5) In (1) to (3), the first metal layer and the second metal layer may be electrically connected by means of a bridge portion composed of a metal layer, and the first metal layer and the second metal layer may be maintained at the same potential.

(6) In (1) to (5), the first metal layer and the second metal layer may be metal layers stacked in the same process by sputtering or vapor deposition.

DETAILED DESCRIPTION OF THE INVENTION

Hereinafter, organic EL display devices according to embodiments of the invention will be described with reference to the drawings.

First Embodiment

Figure 1:
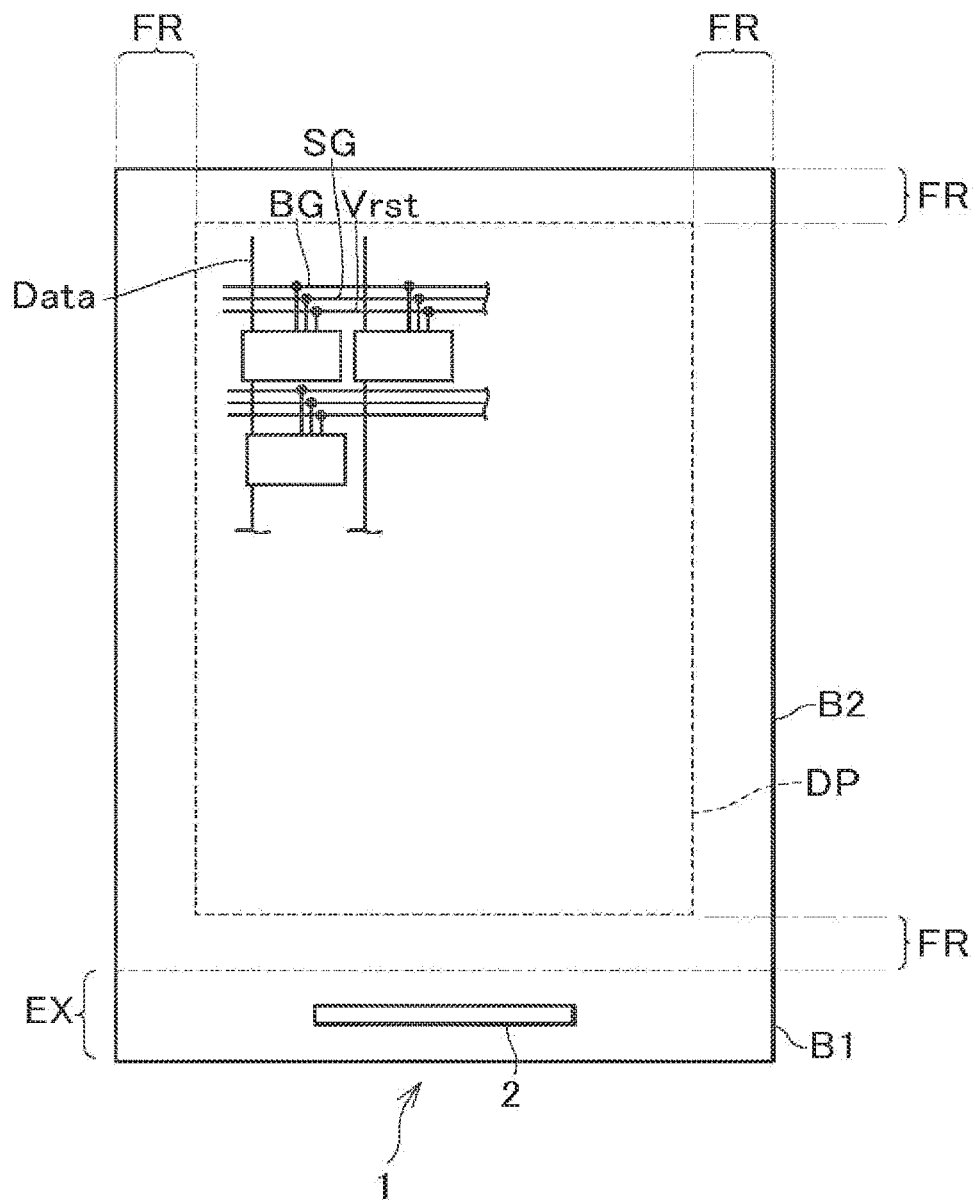
FIG. 1 is a plan view schematically showing an organic EL display device according to a first embodiment.

FIG. 1 is a schematic plan view for explaining an organic EL display device 1 of a first embodiment. The organic EL display device 1 of the embodiment is configured by bonding a counter substrate B2 to an element substrate in which a plurality of organic electroluminescent elements are disposed. In an area (exposed area EX) exposed from the counter substrate B2 in the element substrate B1, a driver IC 2 for driving the organic EL display device 1 is disposed.

In a display area DP of the organic EL display device 1, a plurality of pixels as objects of display control are arranged in a matrix. In each of the pixels, the organic electroluminescent element (self-light-emitting element) is disposed. As shown in FIG. 1, a first scanning line BG, a second scanning line SG, a reset wire Vrst, and a video signal line Data are connected to each of the pixels of the display area DP. The first scanning line BG, the second scanning line SG, and the reset wire Vrst are laid so as to be parallel to an X-direction, and the video signal line Data is laid so as to be parallel to a Y-direction. Although omitted in FIG. 1, a plurality of power supply lines that supply the self-light-emitting elements with power are laid so as to be parallel to the Y-direction.

The driver IC 2 in the embodiment is configured to include a signal line driver circuit for outputting a video signal to each of the video signal lines Data and a scanning line driver circuit for outputting various signals to the first scanning line BC, the second scanning line SG, and the reset wire Vrst. Wires are routed from the driver IC through a picture-frame area FR located around the periphery of the display area DP, to thereby supply the first scanning line BG and the like with the signals. The scanning line driver circuit or the video signal line driver circuit included in the driver IC 2 may be configured as a peripheral circuit in the picture-frame area FR.

The driver IC 2 is connected with, via bumps and an anisotropic conductive film, a plurality of terminals formed in the exposed area of the organic EL display device 1. Hence, the heat of the driver IC 2 generated by the driving of the organic EL display device 1 is transmitted to the plurality of terminals formed on the element substrate B1 and to the surroundings of the terminals.

Figure 2:
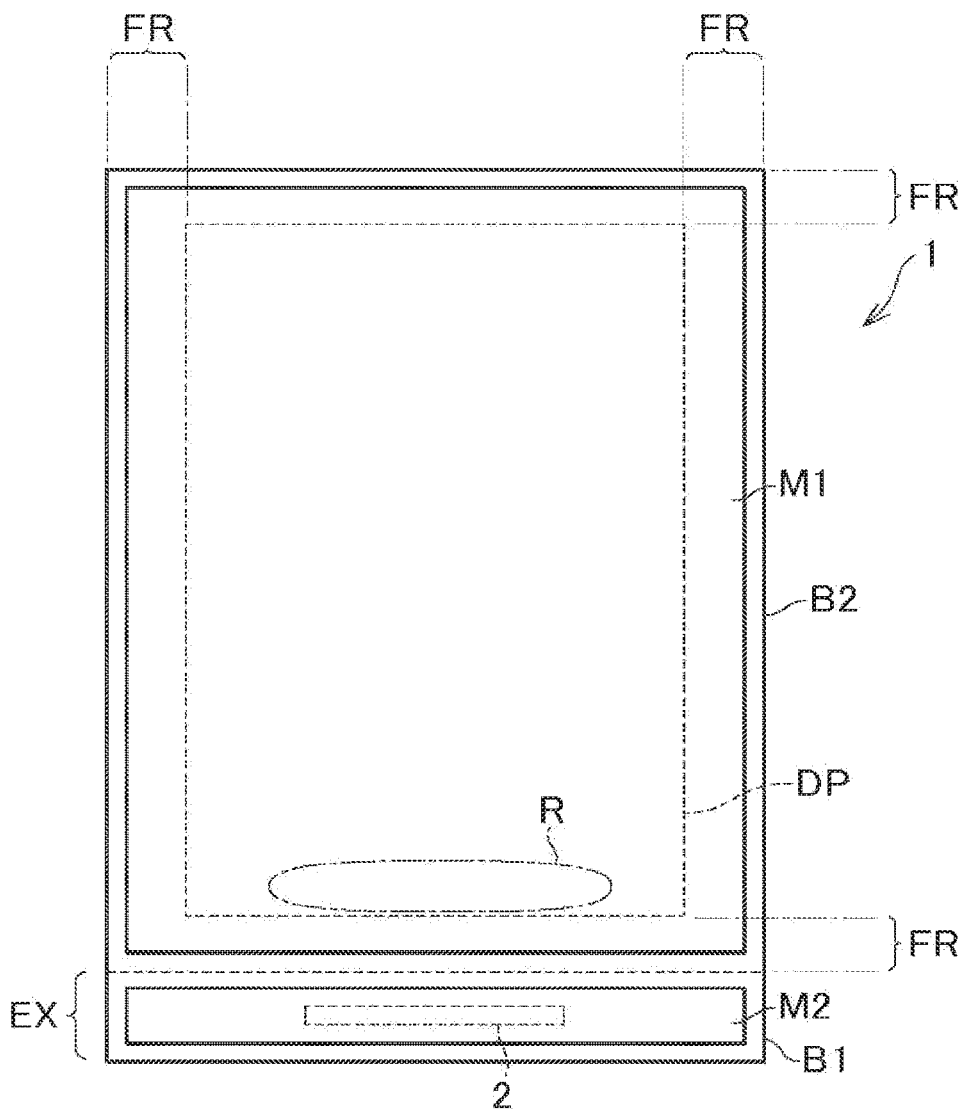
FIG. 2 is a plan view schematically showing the state of a reverse surface of the organic EL display device in the first embodiment.

Here, especially FIG. 2 schematically shows the state of a reverse surface of the organic EL display device 1 of the embodiment. As shown in the drawing, a first metal layer M1 is disposed in a position corresponding to the reverse surface of the display area DP, and a second metal layer M2 is disposed in a position corresponding to the reverse surface of the attached place of the driver IC 2. That is, the first metal layer M1 and the second metal layer M2 are disposed on a surface of the element substrate B1, which is composed of a glass substrate or the like, opposite to a self-light-emitting element-forming surface.

In the embodiment, the first metal layer M1 is disposed so as to entirely overlap the display area DP and further overlap the picture-frame area FR located around the periphery of the display area DP, whereby dissipation, dispersion, and equalization of heat generated in the display area DP are facilitated. Similarly, the second metal layer M2 is disposed so as to extend longer than the driver IC 2 while overlapping the entire driver IC 2 (disposed so as to extend longer than the length of the driver IC 2 in the longitudinal direction thereof), whereby the reverse surface of the exposed area EX is effectively utilized and thus the heat is dissipated and equalized in an area wider than the area of the driver IC 2.

Further, a space is present between the first metal layer M1 and the second metal layer M2, and the space substantially corresponds to a position on the reverse surface of the boundary between the counter substrate B2 and the exposed area EX. Since the space is present between the first metal layer M1 and the second metal layer M2, transmission of heat from the central place of the driver IC 2 in which heat generation is large to the display area DP is prevented, so that the influence on the life of the self-light-emitting elements in the central place in a dashed-dotted line frame R) of the edge portion of the display area DP on the driver IC 2 side and in the vicinity of the central place is suppressed.

Figure 3:
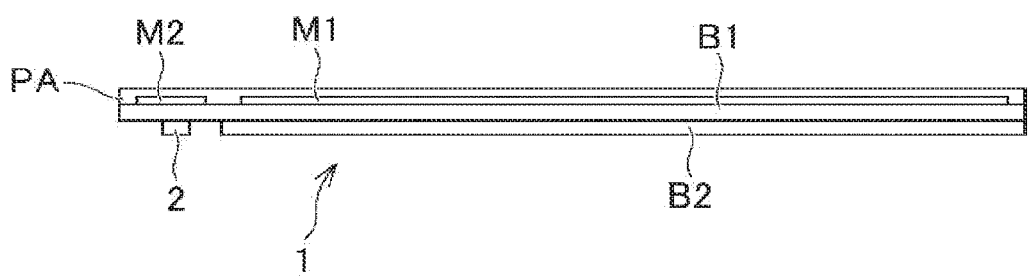
FIG. 3 shows the state of a cross section at a predetermined position in the organic EL display device in the first embodiment.

FIG. 3 shows a cross-sectional view of the organic EL display device 1 of the embodiment. The first metal layer M1 and the second metal layer M2 of the embodiment are formed by stacking, for example, metal having a high heat conductivity such as Al or Cu by a method such as vapor deposition or sputtering using a rough mask. Moreover, as shown in the drawing, the first metal layer M1 and the second metal layer M2 are covered with a protective layer PA composed of an organic insulating film such as acrylic resin (the protective layer PA is not shown in FIG. 2). Since the first metal layer M1 and the second metal layer M2 are covered with the protective layer PA, the peeling-off or breakage of the first metal layer M1 and the like is prevented in the later process, and further, it is possible to reduce an adverse effect in the later process due to the generation of foreign substances caused by the peeling-off or the like. Moreover, it is also possible to prevent the corrosion of the first metal layer M1 and the like.

Second Embodiment

Figure 4:
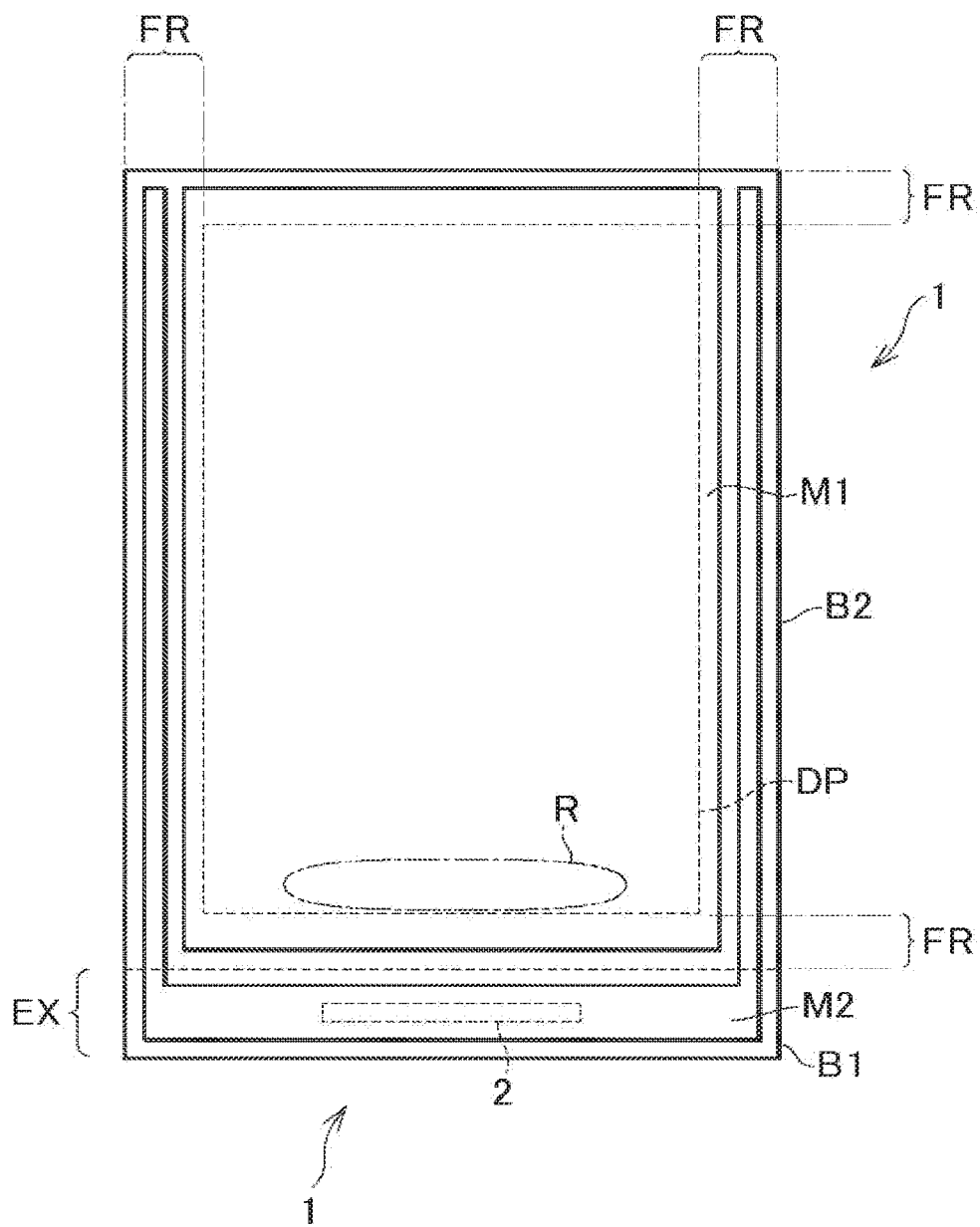
FIG. 4 shows the state of a reverse surface of an organic EL display device in a second embodiment.

Next, a second embodiment of the invention will be described. FIG. 4 schematically shows the state of a reverse surface of an organic EL display device 1 of the second embodiment.

As shown in the drawing, in the organic EL display device 1 of the second embodiment, a second metal layer M2 is bent, and extends linearly on the reverse surface of a picture-frame area FR. The picture-frame area FR in the embodiment is an area overlapping a counter substrate 32 and surrounding the periphery of a display area DP. The second metal layer M2 extends linearly, on the reverse surface of an element substrate B1, so as to be along the periphery of an area overlapping the display area DP.

In this manner, since the second metal layer M2 extends from the reverse surface of the exposed area EX to the place overlapping the counter substrate B2, the area of a heat conductive material is widely secured. (the heat capacity of the heat conductive material is increased), and thus the equalization of heat generated from the driver IC 2 is further facilitated. Moreover, since a Portion of the second metal layer M2 extending to overlap the counter substrate B2 is also disposed with a space between the portion of the second metal layer M2 and the first metal layer M1, the heat generated in the driver IC 2 is prevented from transmitting to the display area DP (the reverse surface thereof).

The organic EL display device 1 of the second embodiment differs from the organic EL display device 1 of the first embodiment in the points described above, but is configured substantially similarly to the organic EL display device 1 of the first embodiment except for the points. Therefore, the description is appropriately omitted.

In the organic EL display device 1 of the second embodiment, the second metal layer M2 is configured so as to extend at two places on the reverse side of the picture-frame area FR. However, the second metal layer M2 may be configured so as to extend at one place on the reverse side of the picture-frame area FR. Moreover, the second metal layer M2 is configured so as to extend, starting from an edge portion of the picture-frame area FR on the exposed area EX side toward an edge portion on the other side, along the display area DP.

Third Embodiment

Figure 5:
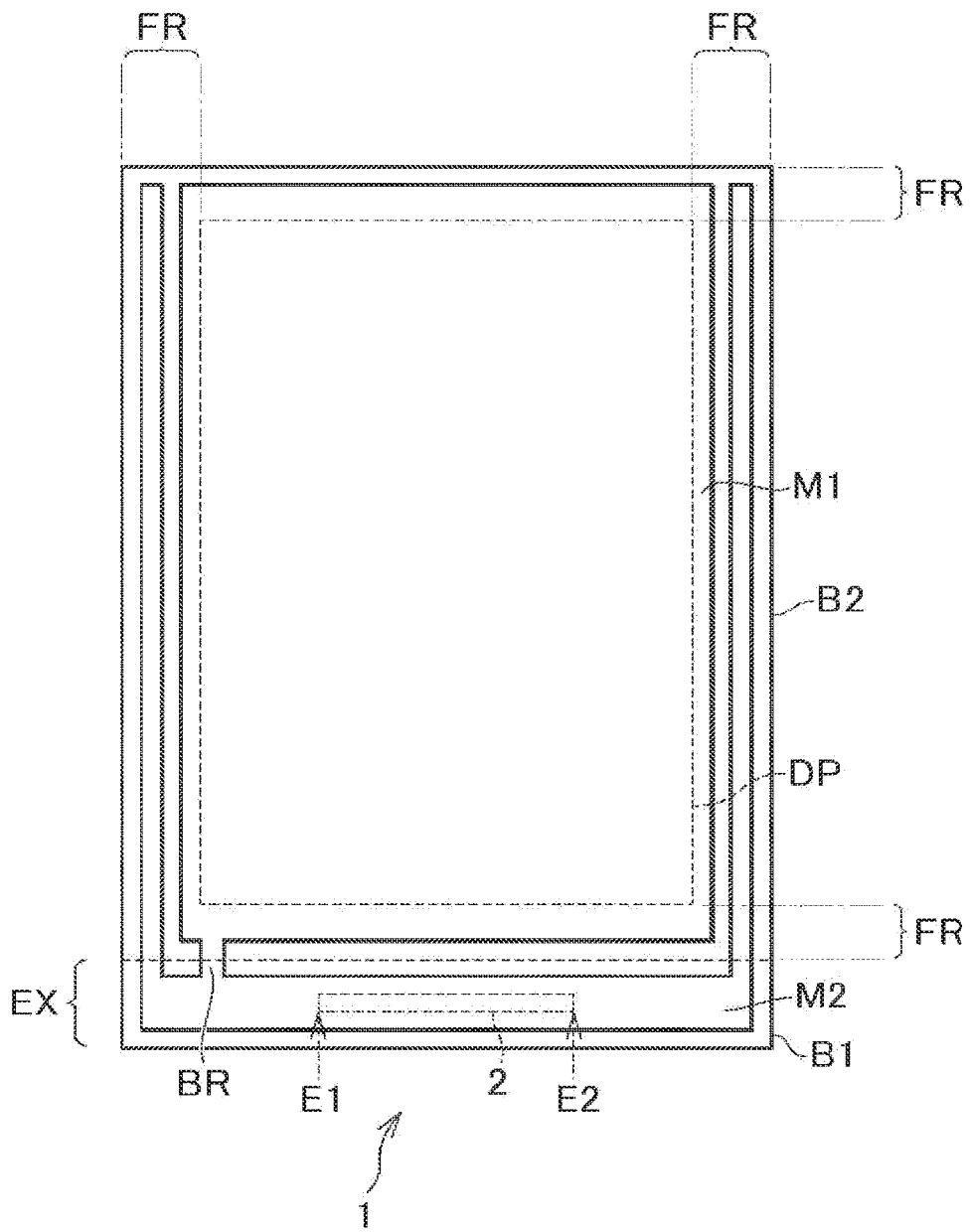
FIG. 5 shows the state of a reverse surface of an organic EL display device in a third embodiment.

Next, a third embodiment of the invention will be described. FIG. 5 schematically shows the state of a reverse surface of an organic EL display device 1 of the third embodiment. In the first embodiment and the second embodiment, the two metal layers, the first metal layer M1 and the second metal layer M2, are formed in an island-like pattern in which the two metal layers are independent of each other and not continuous with each other, and thus separated from each other; whereas, the organic EL display device 1 of the third embodiment differs from the first embodiment and the second embodiment in that two metal layers are connected by means of a bridge portion BR.

As shown in the drawing, in the organic EL display device 1 of the third embodiment, a second metal layer M2 and a first metal layer M1 are connected via the bridge portion BR, whereby the two metal layers are at the same potential to function as an electrostatic barrier of an element substrate B1. The bridge portion BR in the embodiment is composed of metal of the same kind as the first metal layer M1 and the like. The first metal layer M1 and the like may be connected, via a contact hole, with a wiring layer that provides a predetermined potential, and the wiring layer may be provided with a predetermined potential from a flexible printed board connected in the exposed area EX where the driver IC 2 is disposed.

Moreover, when the bridge portion BR is set as in the embodiment, a contact point between the bridge portion BR and the second metal layer M2 is desirably disposed so as to be separated as far as possible from the driver IC 2. As shown in FIG. 5, the longitudinal direction of the exposed area EX and the longitudinal direction of the driver IC 2 are disposed so as to be substantially parallel to each other; it is better for the bridge portion BR to be formed avoiding an area between two longitudinal-direction ends E1 and E2 of the driver IC 2 having a rectangular-shaped structure; and a space between the first metal layer M1 and the second metal layer M2 is desirably secured in the area between the longitudinal-direction ends E1 and E2. Moreover, the bridge portion BR may connect a portion of the second metal layer M2 extending in the picture-frame area FR with the first metal layer M1.

Although, in the embodiments, the protective layer PA composed of the organic insulating film and covering the first metal layer M1 and the second metal layer M2 is formed, the invention is not limited to such a form. The protective layer PA may be formed of an inorganic insulating film (such as $SiN_x$), or the protective layer PA may not be formed.

Although the first metal layer M1 and the second metal layer M2 are desirably formed simultaneously in the same process by a method such as vapor deposition or sputtering as in the embodiments, the invention is not limited to such a form. For example, the first metal layer M1 and the second metal layer M2 may be formed individually by attaching a metal thin film with an adhesive.

Although the display device in each of the embodiments is the organic EL display device 1, the invention is not limited to this. For example, the display device may be a display device including a self-light-emitting element such as a quantum-dot light emitting diode (QLED) in each of the pixels of the display area DP.

The invention is not limited to the embodiments described above, but various modifications can be made. Various altered and modified examples within the range of the idea of the invention will occur to those skilled in the art, and it is understood that the altered and modified examples also belong to the scope of the invention. For example, when those skilled in the art appropriately add or remove a component or change the design of a component in the embodiments described above, or add or omit a process or change the conditions of a process in the embodiments described above, those are included in the scope of the invention as long as they include the gist of the invention. While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
    a plurality of organic emitting elements;
    an element substrate which has a first surface including a display region on which the plurality of organic elements are arranged, the first surface including a peripheral region surrounding the display region;
    a driver IC; and
    a thermal dispersion film on a second surface of the element substrate, the second surface being opposite to the first surface, wherein
    in plan view, the element substrate has a rectangular shape and has a first side, a second side, a third side facing the first side, and a fourth side facing the second side, a first length of each of the first and third sides is longer than a second length of each of the second and fourth sides,
    the thermal dispersion film overlaps the driver IC in plan view,
    the thermal dispersion film has a fifth side and a sixth side in plan view,
    the fifth side faces the second and fourth sides in plan view, and the sixth side faces the first and third sides in plan view, and
    a third length of the fifth side is shorter than the second length, and a fourth length of the sixth side is shorter than the third length.

2. The display device according to claim 1, wherein the thermal dispersion film is made of metal.

3. The display device according to claim 2, wherein the thermal dispersion film is a copper film or an aluminum film.

4. The display device according to claim 1, wherein the driver IC is arranged in the peripheral region in plan view.

5. The display device according to claim 1, further comprising a counter substrate on the organic emitting elements,
    wherein the counter substrate covers all areas of the display region and a part of the thermal dispersion film in plan view.

6. The display device according to claim 1, further comprising a protective layer including an insulating layer and covering the thermal dispersion film and the second surface.

7. The display device according to claim 1, further comprising a metal film on the second surface,
    wherein the display region overlaps the metal film, and
    wherein a first plane size of the metal film is larger than a second plane size of the thermal dispersion film.

8. The display device according to claim 1, wherein the peripheral region overlaps the thermal dispersion film in plan view.

9. The display device according to claim 1, wherein the thermal dispersion film includes a first portion having the fifth and sixth sides and a second portion,
    wherein the second portion has a seventh side being parallel to the first side, and
    wherein the sixth side is shorter than the seventh side.

10. A display device comprising:
    a plurality of organic emitting elements;
    an element substrate which has a first surface including a display region on which the plurality of organic elements are arranged, the first surface including a peripheral region surrounding the display region;
    a driver IC; and
    a thermal dispersion film on a second surface of the element substrate, the second surface being opposite to the first surface, wherein
    the thermal dispersion film overlaps the driver IC in plan view,
    the display region has an area which doesn't overlap the thermal dispersion film in plan view.

11. The display device according to claim 10, wherein the thermal dispersion film is made of metal.

12. The display device according to claim 11, wherein the thermal dispersion film is a copper film or an aluminum film.

13. The display device according to claim 10, wherein the driver IC is arranged in the peripheral region in plan view.

14. The display device according to claim 10, further comprising a counter substrate on the organic emitting elements,
  wherein the counter substrate covers all areas of the display region and a part of the thermal dispersion film in plan view.

15. The display device according to claim 10, further comprising a protective layer including an insulating layer and covering the thermal dispersion film and the second surface.

16. The display device according to claim 10, further comprising a metal film on the second surface,
  wherein the display region overlaps the metal film, and
  wherein a first plane size of the metal film is larger than a second plane size of the thermal dispersion film.

17. The display device according to claim 10, wherein the peripheral region overlaps the thermal dispersion film in plan view.

18. The display device according to claim 10, wherein in plan view, the element substrate has a rectangular shape and has a first side, a second side, a third side facing the first side, and a fourth side facing the second side, a first length of each of the first and third sides is longer than a second length of each of the second and fourth sides,
  wherein the thermal dispersion film includes a first portion and a second portion,
  wherein the first portion has a fifth side extending along the second or fourth side and a sixth side facing the first or third side,
  wherein the second portion has a seventh side extending along the first or third side and an eighth side facing the second or fourth side,
  wherein the sixth side is shorter than the seventh side.

19. A display device comprising:
  a plurality of organic emitting elements;
  an element substrate has a first surface including a display region on which the plurality of organic elements are arranged, the first surface including a peripheral region surrounding the display region;
  a driver IC; and
  a first film on a second surface of the element substrate, the second surface being opposite to the first surface, wherein
  in plan view, the element substrate is a rectangular shape and has a first side, a second side, a third side facing the first side, and a fourth side facing the second side, a first length of each of the first and third sides is longer than a second length of each of the second and fourth sides,
  the first film overlaps the driver IC in plan view,
  the first film has a fifth side and a sixth side in plan view,
  the fifth side faces the second and fourth sides in plan view, and the sixth side faces the first and third sides in plan view, and
  a third length of the fifth side is shorter than the second length, and a fourth length of the sixth side is shorter than the third length.

20. The display device according to claim 19, wherein the first film is made of metal.

21. The display device according to claim 20, wherein the first film is a copper film or an aluminum film.

22. The display device according to claim 19, wherein the driver IC is arranged in the peripheral region in plan view.

23. The display device according to claim 19, further comprising a counter substrate on the organic emitting elements,
  wherein the counter substrate covers all areas of the display region and a part of the first film in plan view.

24. The display device according to claim 19, further comprising a protective layer including an insulating layer and covering the first film and the second surface.

25. The display device according to claim 19, further comprising a metal film on the second surface,
  wherein the display region overlaps the metal film, and
  wherein a first plane size of the metal film is larger than a second plane size of the first film.

26. The display device according to claim 19, wherein the peripheral region overlaps the first film in plan view.

27. The display device according to claim 19, wherein the first film includes a first portion having the fifth and sixth sides and a second portion,
  wherein the second portion has a seventh side being parallel to the first side, and
  wherein the sixth side is shorter than the seventh side.

28. A display device comprising:
  a plurality of organic emitting elements;
  an element substrate which has a first surface including a display region on which the plurality of organic elements are arranged, the first surface including a peripheral region surrounding the display region;
  a driver IC; and
  a first film on a second surface of the element substrate, the second surface being opposite to the first surface, wherein
  the first film overlaps the driver IC in plan view,
  the display region has an area which doesn't overlap the first film in plan view.

29. The display device according to claim 28, wherein the first film is made of metal.

30. The display device according to claim 29, wherein the first film is a copper film or an aluminum film.

31. The display device according to claim 28, wherein the driver IC is arranged in the peripheral region in plan view.

32. The display device according to claim 28, further comprising a counter substrate on the organic emitting elements,
  wherein the counter substrate covers all areas of the display region and a part of the first film in plan view.

33. The display device according to claim 28, further comprising a protective layer including an insulating layer and covering the first film and the second surface.

34. The display device according to claim 28, further comprising a metal film on the second surface,
  wherein the display region overlaps the metal film, and
  wherein a first plane size of the metal film is larger than a second plane size of the first film.

35. The display device according to claim 28, wherein the peripheral region overlaps the first film in plan view.

36. The display device according to claim 28, wherein in plan view, the element substrate is a rectangular shape and has a first side, a second side, a third side facing the first side, and a fourth side facing the second side, a first length of each of the first and third sides is longer than a second length of each of the second and fourth sides,
  wherein the first film includes a first portion and a second portion,
  wherein the first portion has a fifth side extending along the second or fourth side and a sixth side facing the first or third side,
  wherein the second portion has a seventh side extending along the first or third side and an eighth side facing the second or fourth side,
  wherein the sixth side is shorter than the seventh side.

* * * * *